(12) United States Patent
Osamu

(10) Patent No.: US 7,932,525 B2
(45) Date of Patent: Apr. 26, 2011

(54) SEMICONDUCTOR LIGHT-EMITTING DEVICE

(75) Inventor: Abe Osamu, Kokubunji (JP)

(73) Assignees: Iwatani Corporation (JP); Iwatani Electronics Corporation (JP)

( * ) Notice: Subject to any disclaimer, the term of this patent is extended or adjusted under 35 U.S.C. 154(b) by 221 days.

(21) Appl. No.: 12/020,401

(22) Filed: Jan. 25, 2008

(65) Prior Publication Data

US 2008/0296592 A1 Dec. 4, 2008

(30) Foreign Application Priority Data

May 29, 2007 (JP) .............................. P2007-141420

(51) Int. Cl.
*H01L 29/20* (2006.01)
*H01L 33/00* (2010.01)
*H01L 31/14* (2006.01)

(52) U.S. Cl. .............. 257/89; 257/603; 257/84; 257/98; 250/552

(58) Field of Classification Search .................... 257/84, 257/603, 89, 98; 250/552
See application file for complete search history.

(56) References Cited

U.S. PATENT DOCUMENTS

| | | | | |
|---|---|---|---|---|
| 6,054,716 A | * | 4/2000 | Sonobe et al. | ........ 250/552 |
| 6,886,962 B2 | * | 5/2005 | Suehiro | ........ 362/241 |
| 2006/0003628 A1 | * | 1/2006 | Long et al. | ........ 439/541.5 |

FOREIGN PATENT DOCUMENTS

| | | |
|---|---|---|
| JP | A-2002-280616 | 9/2002 |
| JP | A-2005-294736 | 10/2005 |

* cited by examiner

*Primary Examiner* — Zandra Smith
*Assistant Examiner* — Neil Prasad
(74) *Attorney, Agent, or Firm* — Stevens Law Group; David R. Stevens

(57) ABSTRACT

A semiconductor light-emitting device includes: a light-emitting semiconductor element arranged on a lead frame; a transparent resin mold covering the light-emitting semiconductor element and the lead frame except a terminal portion of the lead frame; and a reflective surface formed on a bent portion of part of the lead frame. The terminal portion of the lead frame has a terminal structure, which can serve as a combination of a top-view type and a side-view type.

6 Claims, 9 Drawing Sheets

SEMICONDUCTOR LIGHT-EMITTING DEVICE

CROSS REFERENCES TO RELATED APPLICATIONS

Related Application Data

This application and all related applications claim the benefit of parent Japanese Patent Application JP 2007-141420 filed in the Japanese Patent Office on May 29, 2007, the entire contents of which are hereby incorporated herein by reference. This application thus has the priority filing date of May 29, 2007.

BACKGROUND OF THE INVENTION

The invention relates to a semiconductor light-emitting device, which can be applied to a backlight of a liquid crystal display element, a flash light source of a portable camera, or the like.

DESCRIPTION OF THE RELATED ART

Semiconductor light-emitting devices using light-emitting diode elements, which can be applied to a backlight of liquid crystal display elements in portable devices, a flash light source of cameras in portable devices, or the like, have been developed. For illustration in contrast to the invention, examples of conventional semiconductor light-emitting devices of will be described with reference to FIGS. 1 and 2, respectively.

One example of a conventional semiconductor light-emitting device 1 is shown in FIG. 1 and is constructed as follows. Conventional light-emitting diode element (hereinafter, referred to as a LED element) 5 is mounted on a printed-wiring board 4, where a desired wiring pattern 3 is formed on an insulated substrate 2. A case 6 is integrally formed on the wiring pattern 3 via an adhesive layer 7. Here, the case 6 serves as a reflector. Also, the case 6 is filled with a transparent resin 8 and covers the LED element 5. The wiring pattern 3 is formed so that it extends to the backside of the insulated substrate 2 and composed of two wiring portions 3a and 3b. The LED element 5 is placed on one wiring portion 3a to make a connection between a back electrode (not shown) of the LED element 5 and the wiring portion 3a. In addition, the LED element 5 makes a connection between a front electrode (not shown) of the LED element 5 and the other wiring portion 3b via a thin metal wire 9. In this semiconductor light-emitting device 1, among rays of light emitting from the LED element 5, light rays other than those directly output to the upward (i.e., light rays output in the lateral direction) are reflected on a reflective surface 6A of the case 6 and directed upward. As a whole, light is emitted upward from the LED element 5.

Another conventional semiconductor light-emitting device 11 is shown in FIG. 2 and is constructed as follows. A case 14 having a reflective surface is formed on a substrate 13 by injection-molding a resin while a lead frame 12 is placed therein. A LED element 15 is mounted on the lead frame 12 in the case 14 and then covered with a desired fluorescent layer 16, while the case 14 is filled with a transparent resin 17. In this example, the LED element 15 used is a blue LED element and the fluorescent layer 16 used contains both red and yellow fluorescent substances. Here, blue light from the LED element 15 excites light emission from the red-fluorescent substance layer and the yellow fluorescent substance in the fluorescent layer 16 to obtain white light. In this semiconductor light-emitting device 11, among rays of light emitted, light rays output in the lateral direction other than those directly output upward are reflected on a reflective surface 14A, the inner surface of the case 14. As a whole, the white light is emitted upward.

As another example of a conventional device, Japanese Unexamined Patent Application Publication No. 2002-280616 discloses another semiconductor light-emitting device. This light-emitting device is constructed as follows. A package-molded product is provided with a depressed portion and a light-emitting element is then placed in the depressed portion so that the light-emitting element can approach to a positive lead electrode and a negative lead electrode. Subsequently, the depressed portion is filled with a transparent resin. Japanese Unexamined Patent Application Publication No. 2005-294736 proposes still another semiconductor light-emitting device. This light-emitting device is constructed as follows. A LED chip is mounted on a lead frame. A lamp house molded by a light-impermeable resin having a high reflectivity is then formed on the lead frame, followed by filling a depressed portion of the lamp house in which the LED lamp is placed with a light-transparent resin.

According to the related-art semiconductor light-emitting devices, such semiconductor light-emitting devices have a specific structure by devising a terminal portion depending on the output of emitted light. Therefore, there are at least two types of the light-emitting device, a top-view type and a side-view type. The top-view type device is constructed in a flash unit so that light can be perpendicularly output from a substrate-mounting surface. The side-view type device is constructed in a backlight of a liquid crystal display device so that light can be output in parallel to the substrate-mounting surface to input the light into the lateral side of the light-guide plate.

The current goal in developing portable devices is to develop the structures of the semiconductor light-emitting devices installed therein at a minimal size. Conventional structures and methods discussed above can have a difficulty in mounting an LED element of reduced size. Also, the light output efficiency of such conventional structures can be restricted. Here, a light-output efficiency is defined as represented by the following equation (1):

Light-output efficiency=[Amount of light output from LED/Amount of light determined by light-emitting area of LED]∝[(Amount of light determined by light-emitting area of LED×Effective reflectivity×Light absorbency)/Amount of light determined by light-emitting area of LED]

Thus, there exists a need in the art for an LED device that overcomes the shortcomings of conventional devices and methods of making them, where an improved LED could provide optimal light-output efficiency and yet be of minimal size for better manufacture for portable devices. As will be seen, the invention provides such a device, system and method that overcomes these shortcomings in an elegant manner.

BRIEF SUMMARY OF THE INVENTION

The invention provides a system, device and method that uniquely combine the benefits of both a top-view and side-view structure in one monolithic structure. One result is a most novel and useful semiconductor light-emitting device that is a combination of a side-view type and a top-view type, while having an improved light output efficiency even in the case of a small chip size and a relatively reduced structure compared to conventional devices.

In one embodiment of the invention, there is provided a semiconductor light-emitting device including: a light-emitting semiconductor element arranged on a lead frame; a transparent resin mold covering the light-emitting semiconductor element and the lead frame, except a terminal portion of the lead frame; and a reflective surface formed on a bent portion of part of the lead frame. The terminal portion of the lead frame has a terminal structure, which can serve as a combination of a top-view type and a side-view type.

In one example of a semiconductor light-emitting device configured according to the invention, the light-emitting semiconductor element is placed on the lead frame. Part of the lead frame is then bent to provide the reflective surface, followed by covering with the light-transparent resin-molded body. Therefore, the structure of the semiconductor light-emitting device can be simplified and minimized as the number of parts and the number of production steps can be reduced. Light from the light-emitting semiconductor element is output by reflecting on the bent portion of the lead frame, as a result the light-output efficiency (that is, brightness of the output light) can be improved. Furthermore, the semiconductor light-emitting device can correspond to either of top- and side-view type configurations.

Therefore, as described above, a novel and much improved semiconductor light-emitting device configured according to the invention can be provided for a combination of a side-view type and a top-view type LED. According to the invention, even if the light-emitting semiconductor element has a small chip size, the light output efficiency can be improved, while also reducing the number of parts and allowing a more minimized structure.

BRIEF DESCRIPTION OF THE DRAWINGS

FIG. 6A is a top view of the device, FIG. 6B is a cross-sectional view along the line B-B in FIG. 6A, and FIG. 6C is a cross-sectional view along the line C-C in FIG. 6A.

FIG. 9A is a plan view and FIG. 9B is a cross-sectional view.

FIG. 12A is a plan view of the device, and FIGS. 12B and 12C are cross-sectional views of the device for illustrating respective steps of the process.

FIG. 13A, FIG. 13B, and FIG. 13C are cross-sectional views of the device for illustrating respective steps of the process.

DESCRIPTION OF THE PREFERRED EMBODIMENTS

Hereinafter, examples of devices embodying the invention will be described in detail in order to illustrate different embodiments of the invention and certain examples of devices, systems and methods that include such embodiments and that are possible given the novel and useful inventive concepts and discoveries described herein. In the description below, several embodiments are set out with different examples of configurations, alternative components or operational blocks, and related operations. Though various examples describe alternative embodiments, where different components or operational blocks are intended as optional. The invention is directed to broad concepts described below, and are not limited to any particular embodiment or configuration, but extends to the scope defined by the appended claims and all equivalents.

Figure 1:
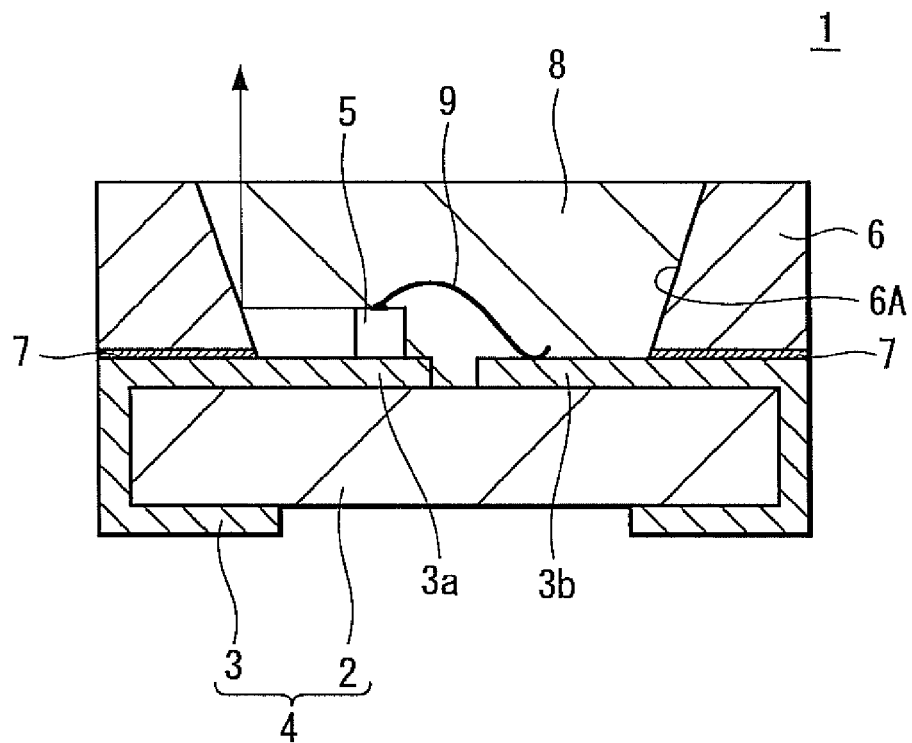
FIG. 1 is a schematic cross-sectional diagram of an example of a semiconductor light-emitting device according to related art.
Figure 2:
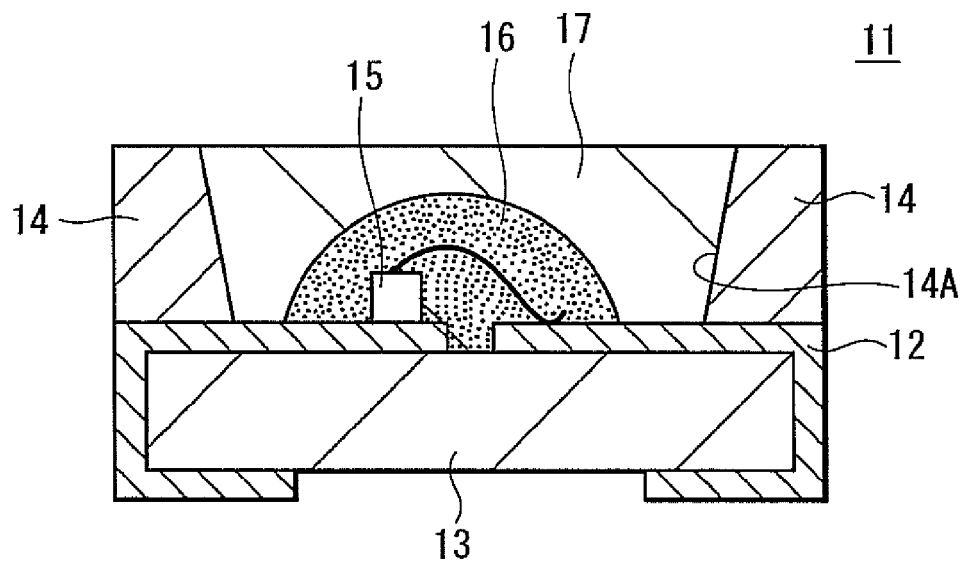
FIG. 2 is a schematic cross-sectional diagram of another example of a semiconductor light-emitting device according to related art.
Figure 3:
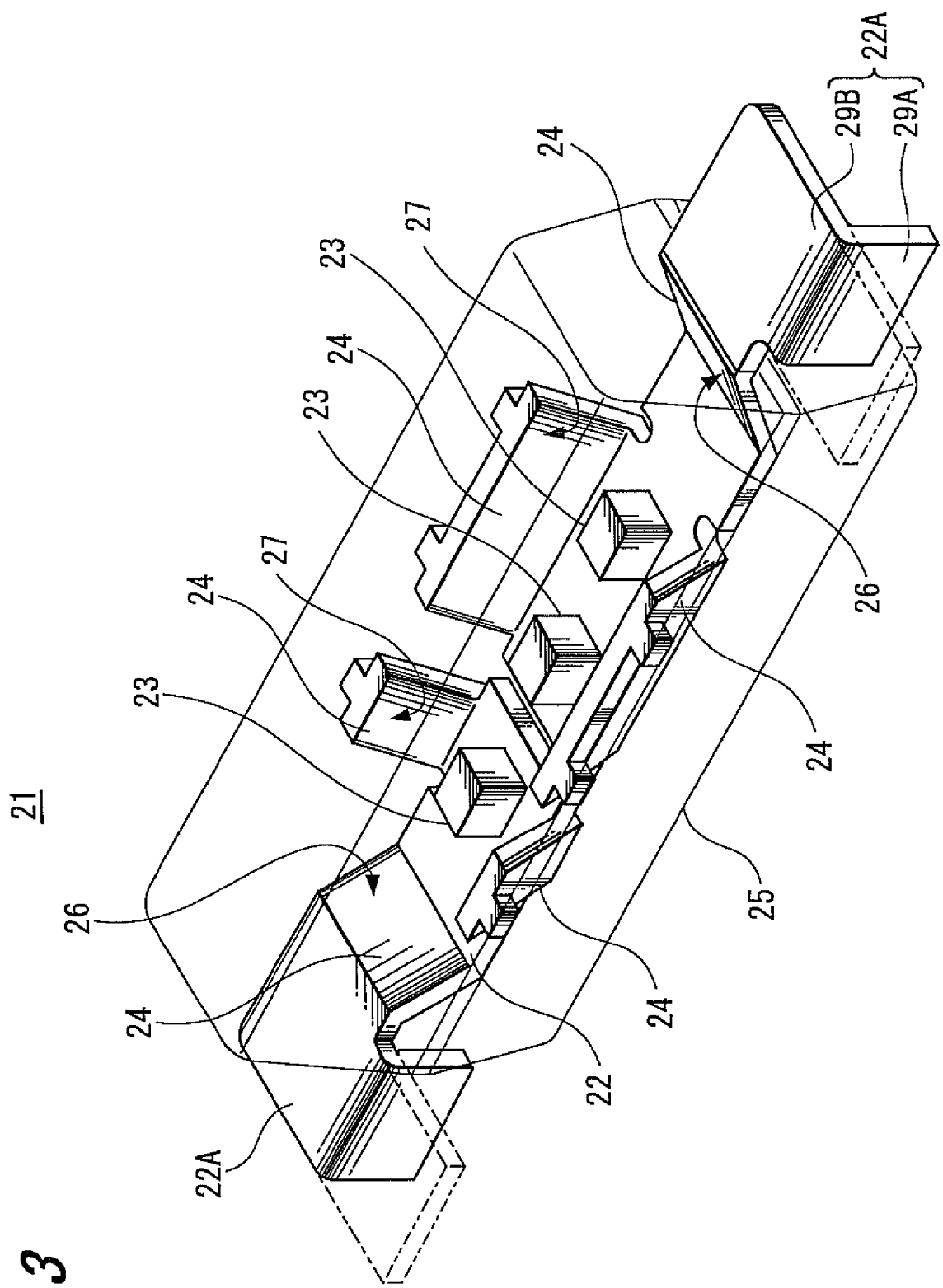
FIG. 3 is a schematic perspective diagram of a semiconductor light-emitting device according to an embodiment of the invention.

FIG. 3 shows a semiconductor light-emitting device configured according to an embodiment of the invention. A semiconductor light-emitting device 21 of the embodiment is constructed as follows. A light-emitting semiconductor element 23 may be mounted on a lead frame 22 as illustrated. Here, part of the lead frame 22 can act as a reflector. In addition, a light-transparent resin-molded body 25 may cover throughout the light-emitting semiconductor element 23 and the lead frame 22, except a terminal portion 22A of the lead frame 22. The light-emitting semiconductor element 23 may be, for example, a LED element.

In the finished structure of the semiconductor light-emitting device 21, the lead frame 22 is formed as an elongated thin member, opposite ends of the lead frame 22 in longitudinal direction (long axis direction) are bent at predetermined angles as shown. Alternatively, they may be bent at inwardly-inclined angles, respectively. Thus, according to the invention, other configurations are possible within the scope of the invention, where different angles may be advantageous for different applications or device specifications. The bent portions may function as light-collecting reflectors 24, respectively. The light-collecting reflectors 24 at opposite ends in the longitudinal direction have inner surfaces provided as reflective surfaces 26.

In addition, opposite ends of the lead frame 22 in the width direction (short axis direction) are bent at predetermined angles, for example, inwardly-inclined angles, respectively. The bent portions may function as light-collecting reflectors 24, respectively. The light-collecting reflectors 24 at the opposite ends in the width direction have inner surfaces provided as reflective surfaces 27, reflectively.

Figure 12A:
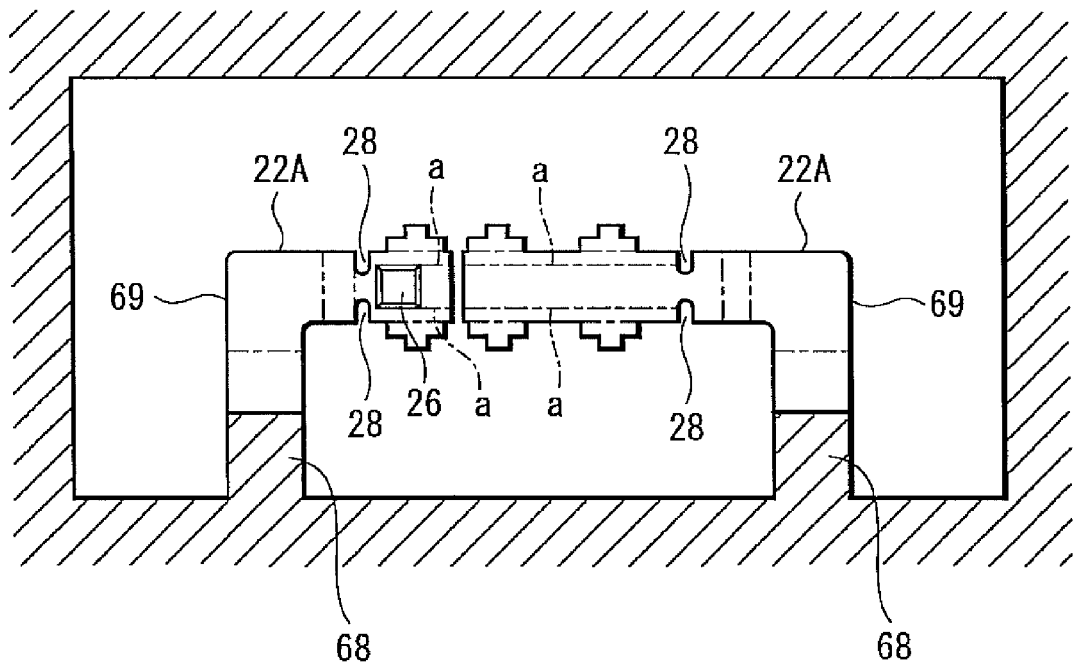
FIGS. 12A through 12C illustrate a method of manufacturing a semiconductor light-emitting device according to an embodiment of the invention (part 1/2), where

The lead frame 22 is electrically divided into two portions for electrically-separating and connecting with opposite electrodes of the light-emitting semiconductor element 23. In addition, as shown in FIG. 12A as later described, notches 28 are formed in the lead frame 22 to divide the both end portions of the lead frame in the width direction, serving as a light-collecting reflector 24, from flat terminal portions 22A. Thus, the bending of opposite ends in the width direction can be facilitated. In other words, the notches 28 allow the bending to be correctly carried out and facilitated along a dashed line a shown in FIG. 12A.

Figure 4:
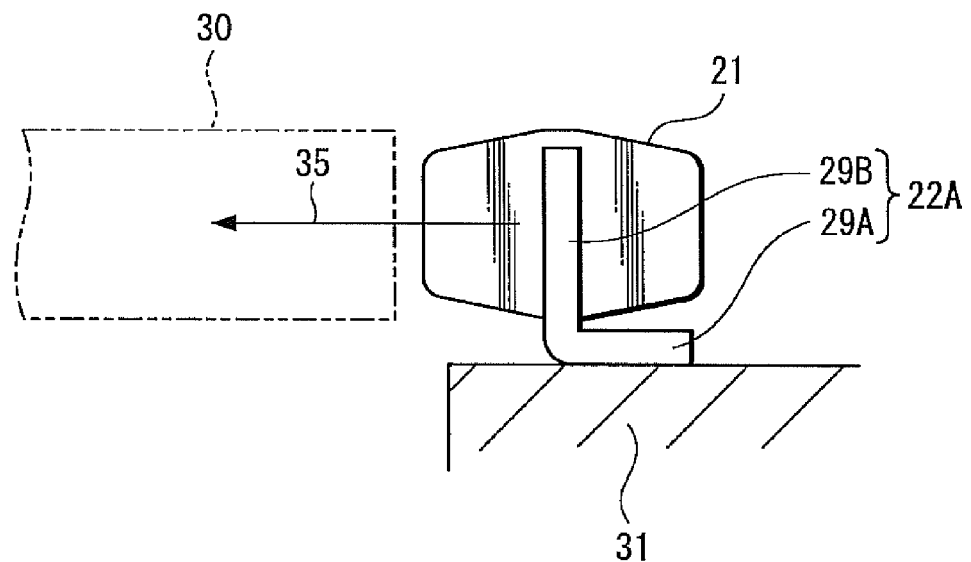
FIG. 4 is an explanatory diagram for illustrating a state of mounting a semiconductor light-emitting device according to an embodiment of the invention on a substrate when the semiconductor light-emitting device is configured in a side-view type.

The terminal portions (or external terminal portions) 22A of the lead frame 22 extend outward from the light-transparent resin-molded body 25. The terminal portions 22A have terminal structures serving as a top-view type and a side-view type. In other words, each of the terminal portions 22A is formed in an L-shape in plan view. Specifically, the terminal portion 22A is formed in the L-shape so that it can cope with any output direction of light from the light-emitting semiconductor element 23. For example, the light-emitting semiconductor apparatus 21 may be placed on the side surface of a light-guide plate 30 (see FIG. 4) to allow light 35 emitted from the light-emitting semiconductor element 23 to be incident on the side surface of the light-guide plate 30. In this case, as shown in FIG. 4, the L-shaped terminal portion 22A may be bent, for example, at a right angle. The surface of a base end portion (or portion parallel to the light-emitting direction) 29A is defined as a surface on which a printed-wiring board 38 is mounted. Therefore, the light 35 emitted from the light-emitting semiconductor element 23 can be output in the direction parallel to the mounting surface for the printed-wiring board 31 and then incident on the side surface of the light-guide plate 30. In this case, the semiconductor light-emitting device 21 of a side-view type is configured.

Figure 5:
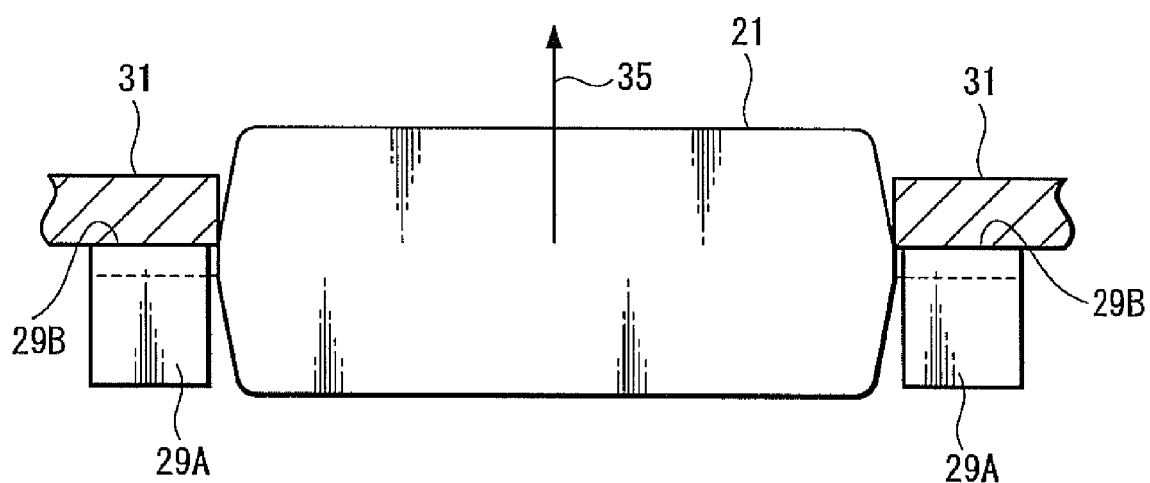
FIG. 5 is an explanatory diagram for illustrating a state of mounting a semiconductor light-emitting device according to an embodiment of the invention on a substrate when the semiconductor light-emitting device is configured in a top-view type.

In addition, as shown in FIG. 5 for example, when the light 35 emitted from the light-emitting semiconductor element 23 is output in the direction perpendicular to the mounting surface for mounting the printed-wiring board 31, the end portion 29A of the L-shaped terminal portion 22A may be cut away. In this case, alternatively, the end portion 29A of the L-shaped terminal portion 22A may remain in L-shape without bending, while the front or back surface thereof is defined as a surface for mounting the printed-wiring board 31. In contrast, part of the terminal portion 22A as shown in FIG. 4 may be bent, so that an end portion 29B thereof having a surface perpendicular to the direction of light emission can be defined as a surface for mounting the printed-wiring board 31. As the end portion 29B is fixed in this way, the light 35 emitted from the light-emitting semiconductor element 23 can be output in the direction perpendicular to the surface for mounting the printed-wiring board 31. In this case, the semiconductor light-emitting device 21 of a top-view type is configured.

The semiconductor light-emitting device 21 electrically connects the terminal portion 22A of the lead frame 22 to the printed-wiring board 31, for example, a flexible print board.

The lead frame 22 is made of a material having both reflective and conductive properties, for example any of those employed in the field of semiconductor technologies, such as Cu, 42-alloy (Fe-based), and Cu-alloy (brass). The lead frame 22 functions as a reflector, so that the lead frame 22 may preferably be made of a material with as high reflectivity as possible. In this embodiment, a metal layer 42 with a high reflectivity may be formed on the base material such as Cu, 42-alloy (Fe-based), or Cu-alloy (brass) of the lead frame 22, by plating or deposition (see FIG. 6B). The metal may be a white metal, such as Ag, Al, or Ni.

Figure 6A:
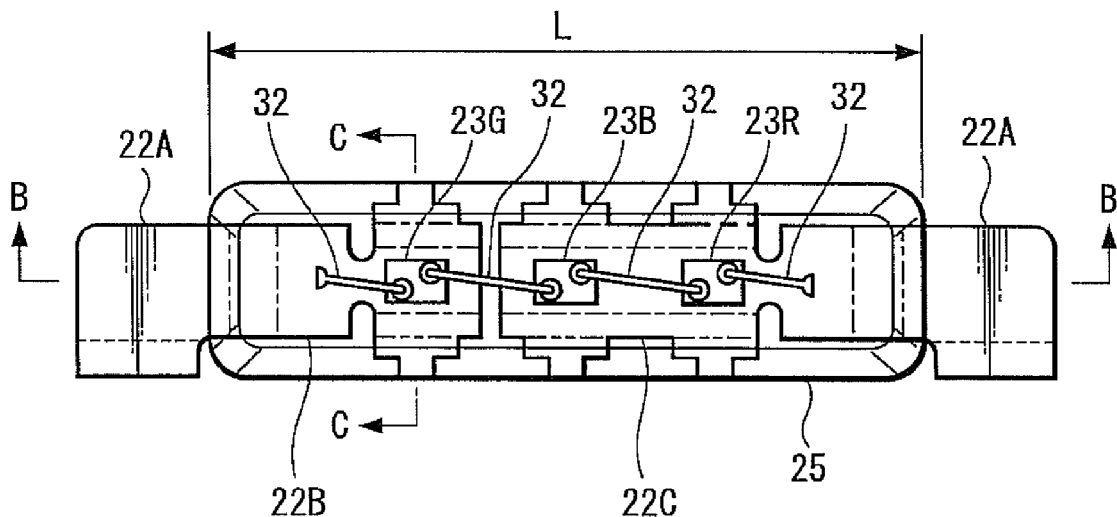
FIGS. 6A through 6C illustrate a semiconductor light-emitting device according to an embodiment of the invention, where
Figure 6B:
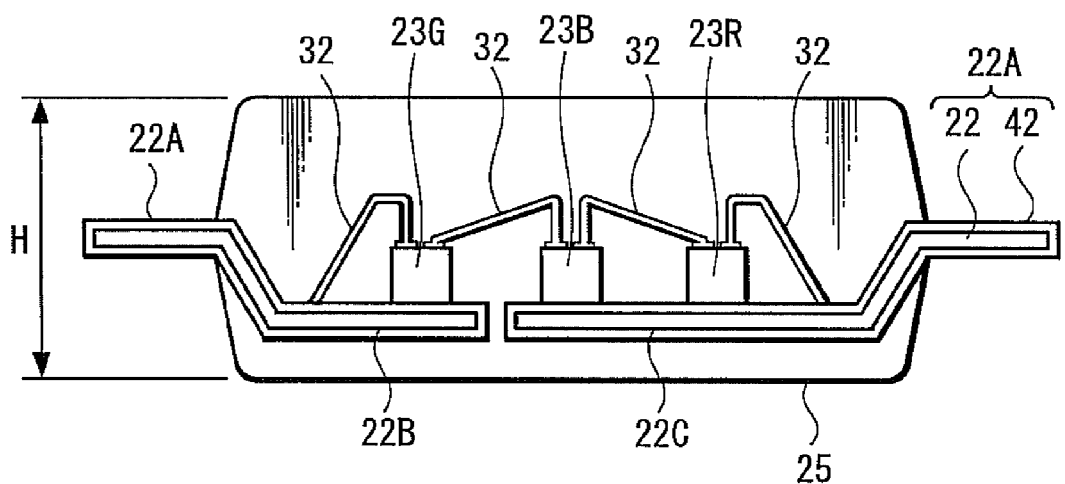
Figure 6C:
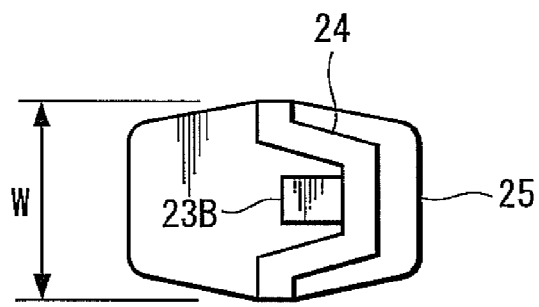

According to the embodiment, the light-emitting semiconductor elements 23 includes three different light-emitting semiconductor elements: a blue light-emitting semiconductor element 23B, a red light-emitting semiconductor element 23R, and a green light-emitting semiconductor element 23G. These elements are longitudinally arranged on the lead frame 22. As shown in FIGS. 6A and 6B, the blue light-emitting semiconductor element 23B is located in the middle of the arrangement. The green light-emitting semiconductor element 23G is mounted on one divided-lead frame portion 22B. Both the blue light-emitting semiconductor element 23 and the red light-emitting semiconductor element 23R are mounted on the other divided-lead frame portion 22C. These three light-emitting semiconductor elements 23B, 23R, and 23G are connected in series through a thin metal wire 32, such as a thin Au wire, by wire-bonding, while being electrically connected to the lead frame 22. White light can be obtained using these three light-emitting semiconductor elements 23R, 23G, and 23B.

Figure 7:
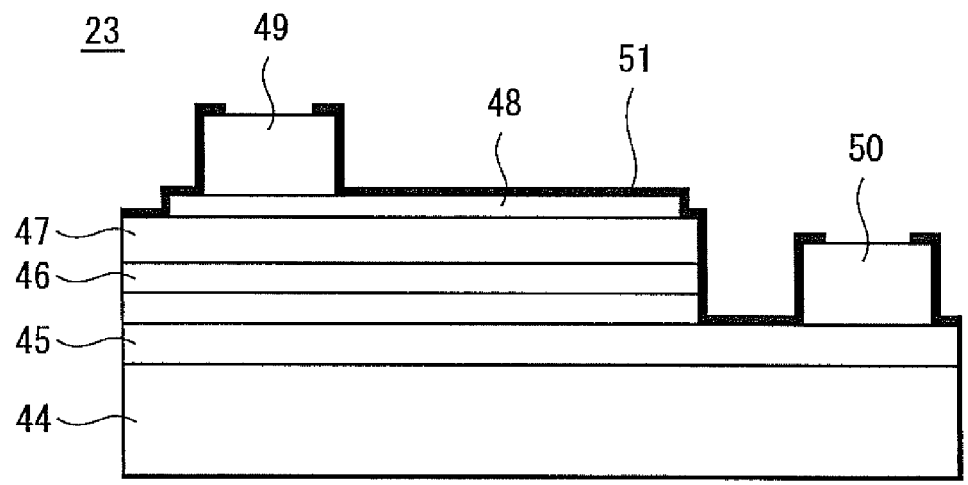
FIG. 7 is a cross-sectional diagram illustrating an example of a light-emitting semiconductor element applied to a semiconductor light-emitting device according to an embodiment of the invention.
Figure 8:
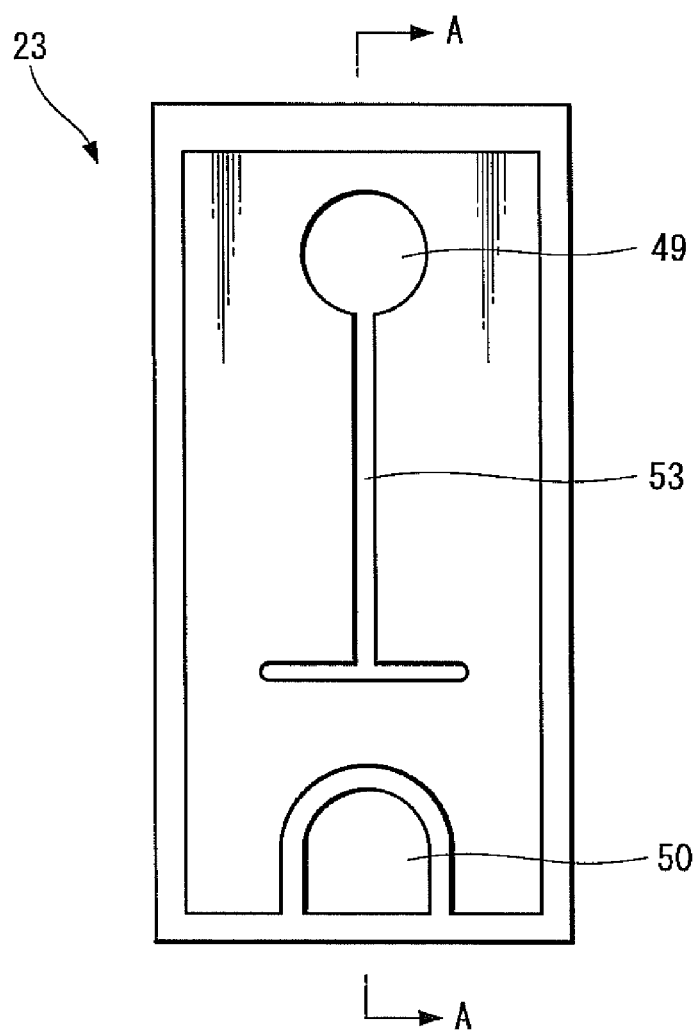
FIG. 8 is a plan view showing an example of a rectangular light-emitting semiconductor element applied to a semiconductor light-emitting device according to an embodiment of the invention.

The light-emitting semiconductor element 23 may be configured, for example, as one shown in FIG. 7 (cross-sectional view along the line A-A in FIG. 8). Specifically, an n-type GaN layer 45, an active layer 46, and p-type GaN layer 47, and a cap layer 48 are stacked on a sapphire substrate 44 in that order. A p-side electrode 49 is formed on the cap layer 48. On the other hand, the resulting stacked body is selectively etched to expose part of the n-type GaN layer 45 and an n-side electrode 50 is then formed thereon. The whole surface of the stacked body, except for the connecting face of the p-side electrode 49 and the n-side electrode 50, is covered with an insulating film to form a passivation film 51.

The dimensions of the semiconductor light emitting device 21 may be specifically, for example, 2.8 mm (L; length)×0.8 mm (W; width)×1.2 mm (H; height) when used for a portable device, such as a mobile phone unit. These numeric values may be defined on the basis of conditions including a mechanical strength. In recent years, there is the tendency to reduce the thickness of a light-guide plate. For example, when the width (W) of the light-guide plate is 0.3 mm, the width (W) of the semiconductor light-emitting device 21 can also be reduced accordingly.

According to the embodiment of the invention, the light-emitting semiconductor element 23 is preferably constructed as a chip in a rectangular shape (or elongated chip) when viewed in a plan view (viewed from the top surface) for obtaining bright light. As shown in FIG. 8, the light-emitting semiconductor element 23 may be formed in a rectangular shape, where the longitudinal direction thereof corresponds to the direction of arranging the light-emitting semiconductor element 23 on the lead frame. In addition, a p-side electrode 49 and an n-side electrode 50 are formed on the opposite ends of the light-emitting semiconductor element (or LED element) 23, respectively. As shown in FIG. 8, an elongated electrode 53 extending from the p-side electrode 49 to the center of the chip is provided for uniform current flow or a uniform current density. This rectangular light-emitting semiconductor element 23 has preferably a horizontal-to-vertical ratio of 1.0:1.2 or more.

A typical light-emitting semiconductor element (LED element) is formed in a square shape when viewed in a plan view.

As a semiconductor light-emitting device has been small-sized more than ever, a reduction in area of the light-emitting semiconductor element 23 leads to a decrease in amount of light emission and also leads to a small-sized lead frame. As a result, for example, a change in arrangement of the light-emitting semiconductor element 23 occurs, causing a decrease in light output efficiency due to a decreased effective reflectivity and an increased light absorption rate.

As described above, the light-emitting semiconductor element 23 is formed in a rectangular shape and arranged so that the longitudinal direction thereof will correspond to the longitudinal direction of the lead frame 22. Therefore, light output efficiency (or brightness of output light) can be improved in comparison to a square light-emitting semiconductor element. Here, the configuration of the light-emitting semiconductor element 23 may be designed as follows. The light-emitting semiconductor element 23 is arranged on the lead frame and a reflective surface is then formed by bending the lead frame to form a reflective surface, which is adjacent to and faces to the side surface of the light-emitting semiconductor element. If the rectangular light-emitting semiconductor element has the same area as that of a square one in a plan view, the length of the rectangular light-emitting semiconductor element facing to the reflective surface is longer than that of the square light-emitting semiconductor element. Therefore, the amount of output light reflected from the reflective surface of the rectangular element is more than that of the square element. As a result, the light output efficiency can be increased and bright light can be output without an increase in size of the chip.

On the other hand, an electrode is formed on the center of a typical square light-emitting semiconductor element. The electrode may act as a light absorber. In order to secure the area for a wire-bonding, the percentage of the area occupied by the electrode increases as the size of the chip decreases. As a result, a reduction in light output efficiency occurs. In contrast, in the case of the rectangular light-emitting semiconductor element 23, as shown in FIG. 8, the p-side electrode 49 and the n-side electrode 50 are formed at the opposite ends of the rectangle. Thus, the light absorption with the electrode decreases while the light output efficiency is improved to that extent.

By making a comparison between the rectangle and the square with respect to the same LED chip area, the light output efficiency of the rectangle increases 30% to 50% more than that of the square. The present inventor has first studied and found out that the rectangular light-emitting semiconductor element shows an increase in light output efficiency as the size of the light-emitting semiconductor element 23 decreases.

According to the semiconductor light-emitting device 21 of the above embodiment, the terminal portion 22A of the lead frame 22 is formed in an L-shape in a plan view. Depending on a top-view type or a side-view type, the terminal portion 22A of the lead frame 22 is bent or retained as it is. Thus, in a single semiconductor light-emitting device 21, both the side view and the top view can be used in common. That is, one package serves as both the side-view type and the top-view type.

Furthermore, the opposite ends of the lead frame in the width direction are partially bent to make light-collecting reflectors 24, respectively. Then, the light from the LED elements 23 is incident on the reflective surface 27 of the light correcting reflector 24. As a result, brightness of output light can be improved without increasing the size of the light-emitting semiconductor element 23, or the size of the chip. The both end portions of the lead frame 22 are bent to provide light-collecting reflectors 24 and the inner surfaces thereof can also function as reflective surfaces 26. Therefore, the reflected light can also be output forward and contributes to an improvement in light output efficiency. Furthermore, unlike a typical structure, any separate light-emitting reflector is not required. Therefore, the number of parts can be reduced. Besides, the number of production steps can also be reduced.

Furthermore, the light output efficiency can be improved by making the light-emitting semiconductor 23 into a rectangular shape.

Figure 9A:
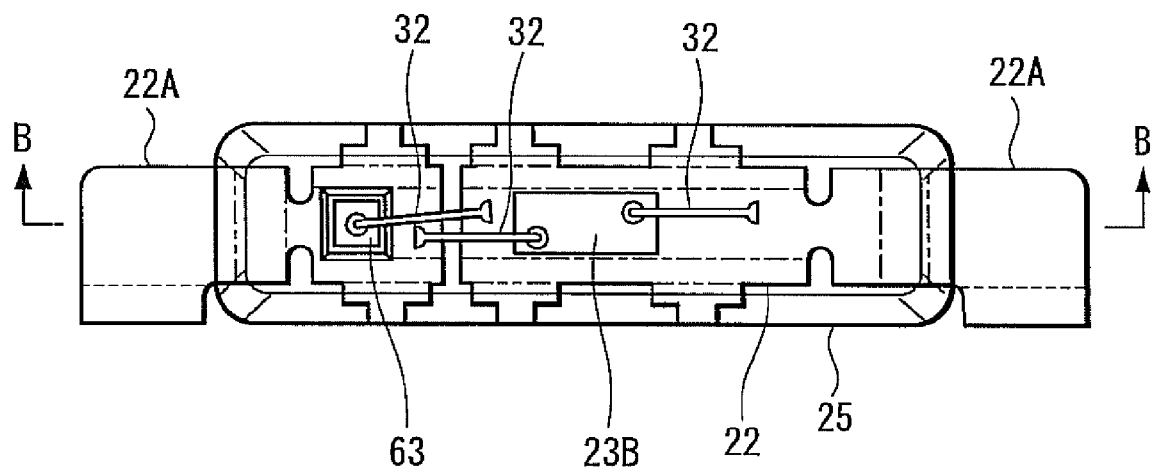
FIGS. 9A and 9B illustrate a semiconductor light-emitting device according to another embodiment of the invention, where
Figure 9B:
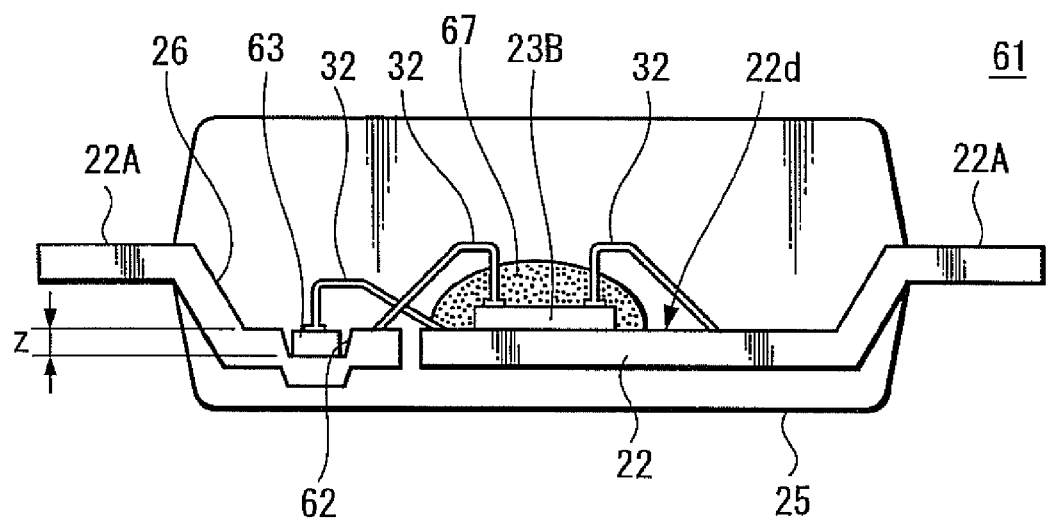
Figure 10:
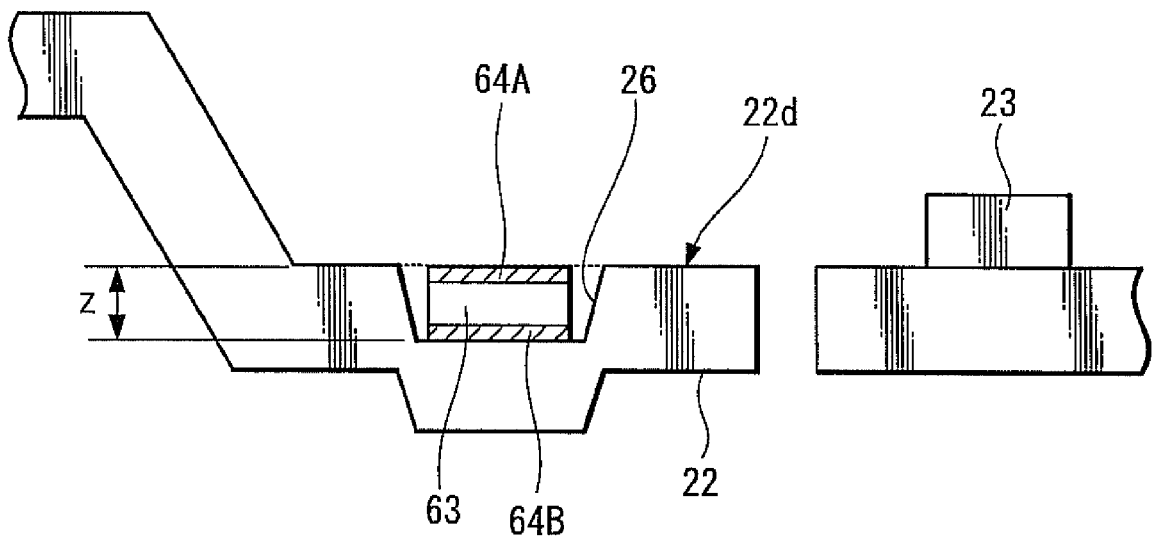
FIG. 10 is an enlarged cross-sectional view showing a substantial part of a semiconductor light-emitting device according to another embodiment of the invention.

In FIGS. 9A, 9B and 10, a semiconductor light-emitting device is shown as another embodiment of the invention. In a semiconductor light-emitting device using a LED element, a protective diode, such as a Zener diode, is built-in for electrostatic protection of the LED element. In the present embodiment, one monochromatic LED element is simultaneously covered with a fluorescent layer to output while light. The present embodiment is applied to the semiconductor light-emitting device with a built-in protective diode.

As shown in FIG. 9B, in a semiconductor light-emitting device 61 according to an embodiment of the invention, a monochromatic light-emitting semiconductor element (blue light-emitting semiconductor element 23B in this embodiment) is arranged on the lead frame 22. Then, a fluorescent layer 67 having red, green, and blue fluorescent substances is formed so as to cover the blue light-emitting semiconductor element 23B, followed by placing the protective diode 63.

In the present embodiment, in particular, a depressed portion 62 is formed on a region of the lead frame 22, on which the protective diode 63 should be arranged. The protective diode 63, on which electrodes 64A and 64B are formed on the front and back surfaces, is arranged so as to hide in the depressed portion 62. As shown in FIG. 10, the depth (Z) of the depressed portion 62 is defined so that the surface of the electrode 64A on the upper surface of the protective diode 63 is on the same horizontal plane as that of the surface 22d of the lead frame 22 on which the light-emitting semiconductor element 23 is placed. Alternatively, it is defined so that the surface of the electrode 64A on the upper surface of the protective diode 63 is lower than the same horizontal plane as that of the lead frame's surface 22d. Other structural components are same as those employed in the embodiment shown in FIG. 3 and FIGS. 6A to 6C, so that the corresponding parts are provided with the same symbols to omit repeated explanations.

According to the semiconductor light-emitting device 61 of the present embodiment as described above, light from the blue light-emitting semiconductor element 23B excites the emission of light from the red, green, and blue fluorescent substances to output white light. In the present embodiment, the protective diode 63 is placed in the depressed portion 62 of the lead frame 22 so as to hide therein. Thus, the protective diode 63 may not block light from the light-emitting semiconductor element 23 in the lateral direction. Therefore, the light from the light-emitting semiconductor element 23 is not absorbed by the protective diode 63, so that an increase in light output efficiency can be attained to that extent. Furthermore, the present embodiment has the same effects as those of the semiconductor light-emitting device 21 according to the previous embodiment.

A chip of the protective diode 63 is typically made of silicon (Si) and the silicon itself is black-colored. Therefore, when the protective diode 63 is placed on the same plane as that of the light-emitting semiconductor element 23, the chip of the protective diode 63 absorbs light emitted from the light-emitting semiconductor element 23 in the lateral direction. As a result, a decrease in light output efficiency may occur. However, as described in the present embodiment, light absorption can be prevented by forming the depressed portion 62 in the lead frame 22 and then placing the protective diode 63 in the depressed portion 62. As a result, light in the lateral direction is reflected on the reflective surface 26 of the end portion of the lead frame 22 to taken out. Therefore, a further improvement in light output efficiency can be obtained.

Figure 11:
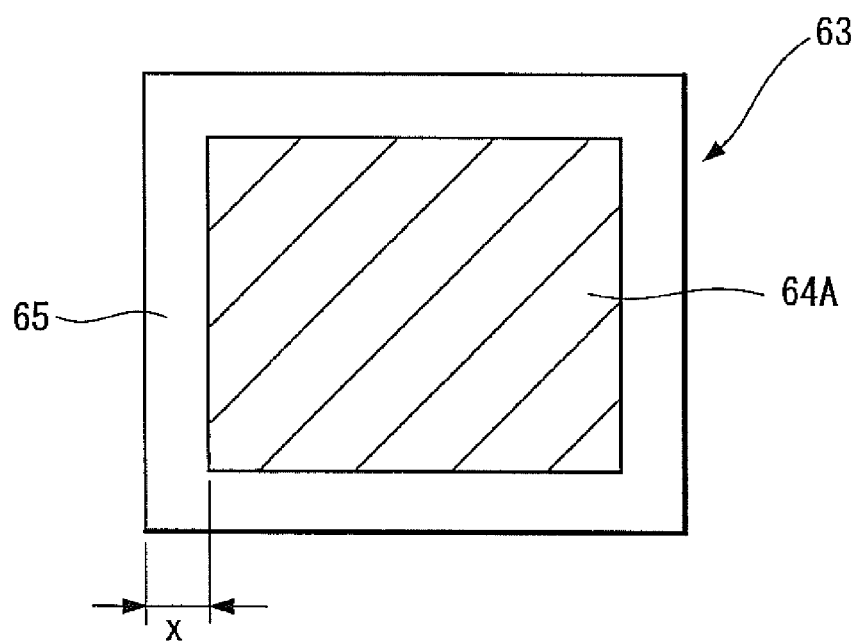
FIG. 11 is a plan view showing an example of a protective diode applied to an embodiment of the invention.

Furthermore, as shown in FIG. 11 for example, the protective diode 63 may be preferably formed with large surface areas of the electrodes 64A and 64B (e.g., Al electrodes) on the front and back surfaces, particularly a large surface area of the electrode 64A for electric connection bonding on the front surface. In other words, as the surface of Si is black-colored and absorbs light, so that a decrease in light output efficiency may occur. However, the light output efficiency can be increased further by forming the large electrode 64A made of Al and providing the electrode 64 with a function as a reflector. In this case, the electrode 64A is formed with a remaining marginal region 65 that can secure a resisting pressure of 8 kV of the protective diode 63, such as the Zener diode. Specifically, the distance between the end of the electrode and the end of the chip or a marginal region 65, which does not include any electrode, has a width (X) of 10 μm to 50 μm, preferably 10 μm to 25 μm. If the distance is narrower than 10 μm, then the 8-kV resisting pressure (i.e., resisting pressure on the p-n junction) may not be obtained. If the distance exceeds 50 μm, it is not preferable because the probability of light absorption increases as the exposed area of the silicon on the protective diode 63 increases. The chip of the protective diode 63 is typically in the form of a square.

The configuration of the semiconductor light-emitting device shown in FIGS. 9A and 9B including the depressed portion 62 formed in the lead frame 22 and the protective diode 63 placed in the depressed portion 62 can be applied to the embodiment shown in FIG. 3, FIGS. 6A and 6B.

A method of manufacturing the semiconductor light-emitting device according to an embodiment of the invention will be described. The embodiment is applied to the manufacture of the semiconductor light-emitting device shown in FIGS. 9A and 9B.

First, as shown in FIG. 12A, the lead frame 22 is formed. The lead frame 22 has the depressed portion 62 on a portion where the protective diode is placed. The lead frame 22 is formed so as to be connected with a periphery portion 69 through a connecting portion 68 extended from terminal portions 22A at the both longitudinal ends.

Figure 12B:
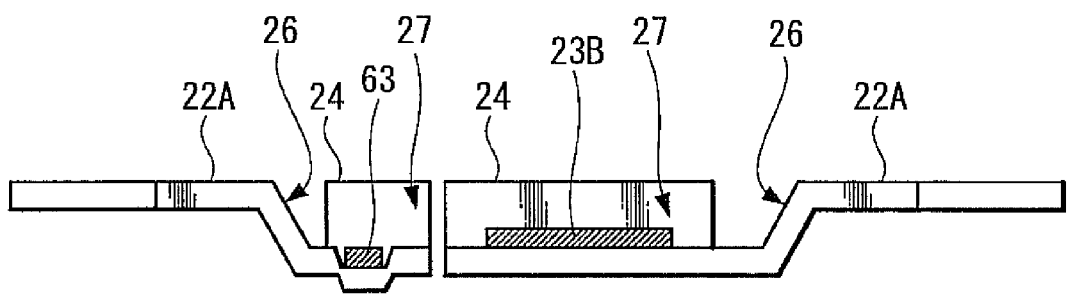

Next, as shown in FIG. 12B, the periphery portion of the lead frame 22 is bent along the dashed line to form a bent portion having a reflective surface. Under such a state, the blue light-emitting semiconductor element 23B is arranged on one of lead frame portions and the protective diode 63 is placed in the depressed portion 62.

Figure 12C:
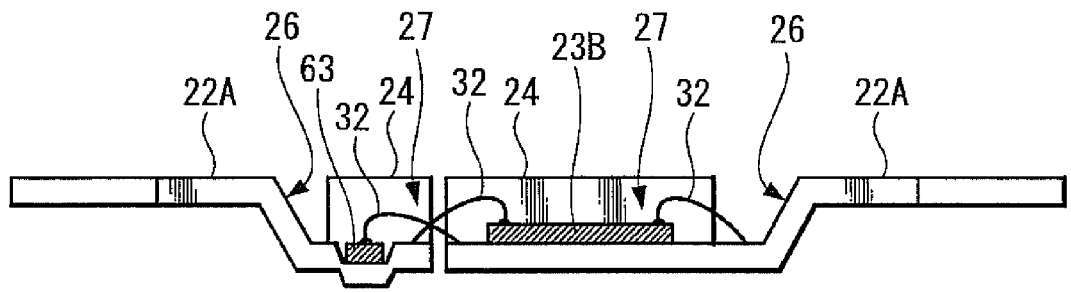

Next, as shown in FIG. 12C, for example, the protective diode 63, the blue light-emitting semiconductor element 23B, and the lead frame 22 are electrically connected with one another by wire-bonding through the thin-metal wire 32.

Figure 13A:
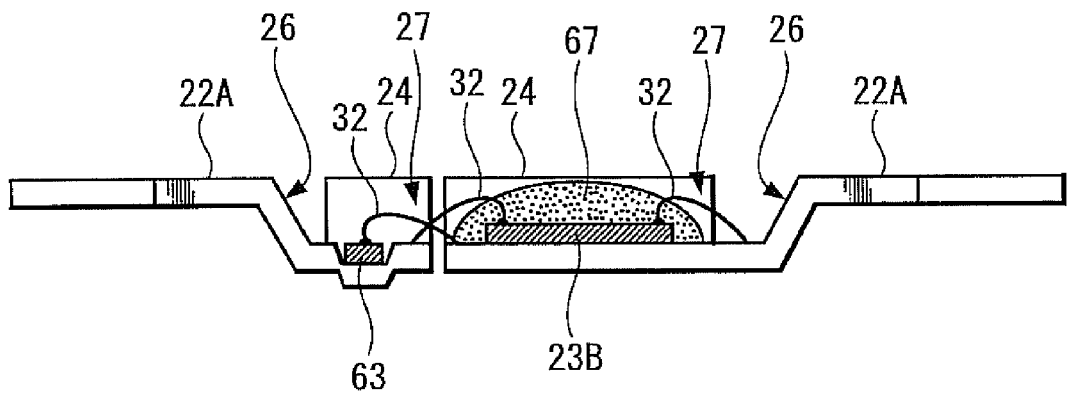
FIGS. 13A to 13C illustrate a method of manufacturing a semiconductor light-emitting device according to an embodiment of the invention (part 2/2), where

Next, as shown in FIG. 13A, the blue light-emitting semiconductor element 23B is covered with the fluorescent layer 67 including fluorescent substances of red, green, and blue.

Figure 13B:
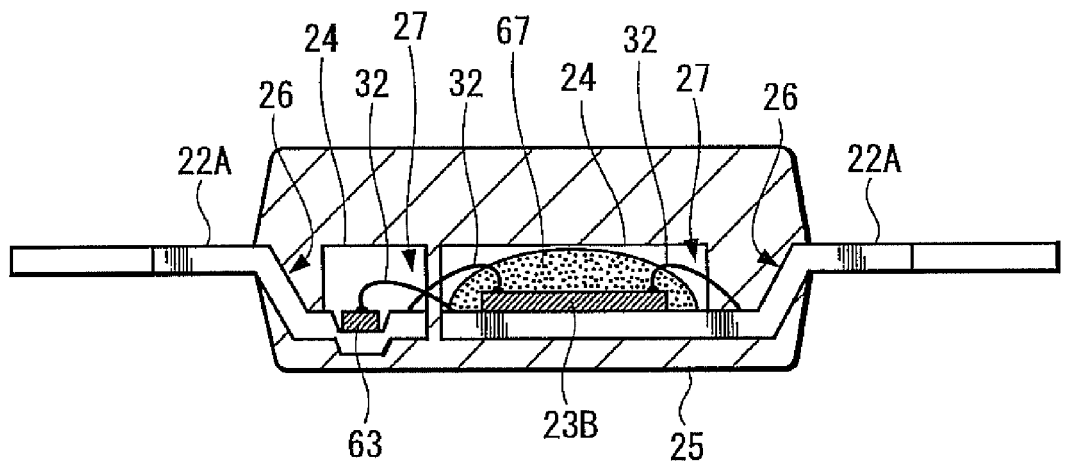

Next, as shown in FIG. 13B, a transfer molding method is employed to mold the lead frame 22, the blue light-emitting semiconductor element 23B with the fluorescent layer 67, and the protective diode 63, except for the terminal portion 22A. In other words, these components are covered with the light-transparent resin-molded body 25.

Figure 13C:
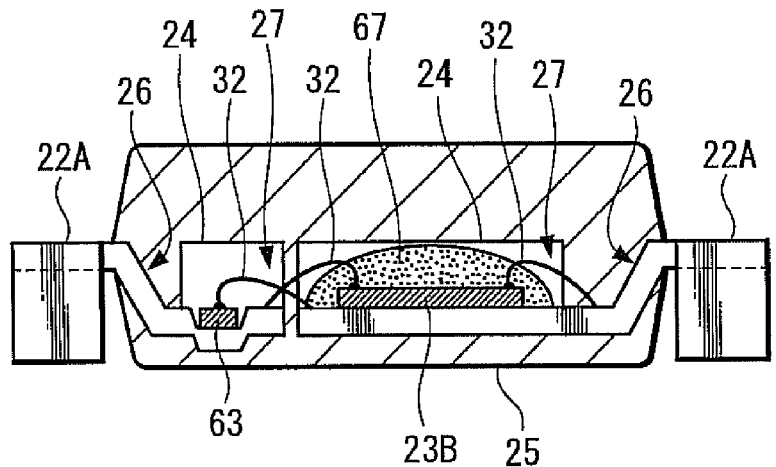

Next, the connecting portion 68 of the lead frame 22 is cut along the dotted line 69 as shown in FIG. 12A. The terminal portion 22A of the lead frame 22, which faces to the outside, is bent depending on a side-view type or a top-view type. Consequently, the semiconductor light-emitting device 61 can be obtained as shown in FIG. 13C. In other words, FIG. 13C illustrates the semiconductor light-emitting device corresponding to the side-view type.

As described above, the method of manufacturing the semiconductor light-emitting device according to an embodiment of the present embodiment can be simplified. In addition, the method of manufacturing the semiconductor light-emitting device 21 as shown in FIG. 3 and FIGS. 6A to 6C can also be carried out on the basis of the steps shown in FIGS. 12A to 12C and FIGS. 13A to 13C.

Having described preferred embodiments of the invention with reference to the accompanying drawings, it is to be understood that the invention is not limited to those precise examples and embodiments described above and illustrated in the drawings, and that various changes and modifications could be effected therein by one skilled in the art without departing from the spirit or scope of the invention as defined in the appended claims and all equivalents.

What is claimed is:

1. A semiconductor light-emitting device, comprising:
   a light-emitting semiconductor element formed in a rectangular shape having long and short sides in a plan view;
   a first reflective surface formed by bending both ends of a lead frame in a longitudinal direction diagonally upward;
   a second reflective surface formed by bending both ends of the lead frame in a widthwise direction diagonally upward, the second reflective surface being adjacent to and facing to both surfaces of said light-emitting semiconductor element in the longitudinal direction;
   a storage portion formed on the lead frame to place and hold thereon said light-emitting semiconductor element such that the longitudinal direction thereof extends along the longitudinal direction of the lead frame, said storage portion being surrounded by said first and second reflective surfaces;
   a terminal portion formed by bending both ends of the lead frame in the longitudinal direction to be parallel with said storage portion, the terminal portion having a terminal structure and serving as a combination of a top-view type and a side-view type;
   a transparent resin mold covering said light-emitting semiconductor element and the lead frame, except said terminal portion of the lead frame.

2. The semiconductor light-emitting device according to claim 1, wherein said terminal portion of said lead frame is L-shaped in a plan view.

3. The semiconductor light-emitting device according to claim 1, further comprising:
   a protective diode arranged in a depressed portion of said lead frame, wherein an upper surface of said protective diode is located below an arrangement plane of said lead frame on which said light-emitting semiconductor element is arranged.

4. The semiconductor light-emitting device according to claim 3, wherein an electrode on the upper surface of said protective diode is formed on the whole surface except a marginal region for securing pressure resistance of said protective diode.

5. The semiconductor light-emitting device according to claim 1, wherein three light-emitting semiconductor elements, respectively, for red light emission, green light emission, and blue light emission are arranged on said lead frame.

6. The semiconductor light-emitting device according to claim 1, wherein a light-emitting semiconductor element for monochromatic light emission is placed on said lead frame, and said light-emitting semiconductor element for monochromatic light emission is covered with a fluorescent layer.

* * * * *